(12) United States Patent
Lee et al.

(10) Patent No.: US 7,154,796 B2
(45) Date of Patent: Dec. 26, 2006

(54) SEMICONDUCTOR MEMORY DEVICE AND DATA READ AND WRITE METHOD THEREOF

(75) Inventors: Hi-Choon Lee, Gyeonggi-do (KR); Wol-Jin Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 76 days.

(21) Appl. No.: 11/009,248

(22) Filed: Dec. 10, 2004

(65) Prior Publication Data

US 2005/0146957 A1 Jul. 7, 2005

(30) Foreign Application Priority Data

Jan. 7, 2004 (KR) ...................... 10-2004-0001001

(51) Int. Cl.
*G11C 7/00* (2006.01)
(52) U.S. Cl. .................. 365/203; 365/63; 365/189.05; 365/205
(58) Field of Classification Search .................. 365/63, 365/189.05, 205, 203
See application file for complete search history.

(56) References Cited

U.S. PATENT DOCUMENTS 5,892,724 A * 4/1999 Hasegawa et al. ..... 365/230.03
5,982,693 A 11/1999 Nguyen
6,246,622 B1 * 6/2001 Sugibayashi ................ 365/210
6,396,732 B1 * 5/2002 Osada et al. ................ 365/156
6,522,565 B1 * 2/2003 Shimazaki et al. ........... 365/63

FOREIGN PATENT DOCUMENTS

| KR | 2000-0019463 | 4/2000 |
|---|---|---|
| KR | 2003-0026010 | 3/2003 |

* cited by examiner

*Primary Examiner*—Hoai V. Ho
(74) *Attorney, Agent, or Firm*—Marger Johnson & McCollom, P.C.

(57) ABSTRACT

A semiconductor memory device includes first and second global data line pairs connected to a local data line pair, allowing a reduced pre-charge voltage that lowers current consumption and increases operating speed. Also included are a sense amplifier for amplifying data of the second global data line pair and outputting the amplified data to a data line, and a write driver for outputting data of the data line to the first global data line pair during a write operation. Switching circuits are connected between the first and second global data line pairs, and the local data line and the first global data line pairs. The memory device further includes a first global data line pre-charge circuit for pre-charging the first global data line pair to a first voltage level, and a second global data line pre-charge circuit for pre-charging the second global data line pair to a second voltage level.

33 Claims, 13 Drawing Sheets

US 7,154,796 B2

SEMICONDUCTOR MEMORY DEVICE AND DATA READ AND WRITE METHOD THEREOF

CROSS-REFERENCE TO RELATED APPLICATION

This application claims the benefit of Korean Patent Application No. 2004-1001, filed Jan. 7, 2004, the disclosure of which is hereby incorporated herein by reference in its entirety.

BACKGROUND OF THE INVENTION

1. Field of the Invention

The present invention relates to a semiconductor memory device and, more particularly, to a semiconductor memory device having a local data line pair and a global data line pair and a data read and write method thereof.

2. Description of the Related Art

A conventional semiconductor memory device includes a local data line pair and a global data line pair to increase the amount of data to be inputted and outputted.

In general, a semiconductor memory device pre-charges a local data line pair and a global data line pair before performing a data write operation and a data read operation, in order to increase data transmission speed. Also, the semiconductor memory device includes a sense amplifier in the global data line pair that amplifies and outputs data from the local data line pair to the global data line pair during a read operation.

FIG. 1 is a view illustrating a signal line arrangement of a memory cell array of a conventional semiconductor memory device.

In FIG. 1, WL denotes one respective word line of the memory cell array, and BL denote one respective bit line of the memory cell array.

In FIG. 1, each of memory cell array blocks BLK1~n includes m sub memory cell arrays blocks blk1~m. The word lines WL are arranged perpendicular to the memory cell array blocks BLK1~n, and the bit lines BL are arranged in a transverse direction. Local data line pairs L/B11~1k to L/Bn1~nk are arranged in a perpendicular direction respectively between the memory cell array blocks BLK1~n, and global data line pairs G/B1~k are arranged in a transverse direction to connect to the local data line pairs L/B11~n1 to L/B1k~nk of the memory cell array blocks BLK1~n, respectively.

In the semiconductor memory device of FIG. 1, the local data line pairs L/B11~1k to L/Bn1~nk are respectively divided to receive/output data from/to the m groups of the sub memory cell array blocks blk1~m of the selected memory cell array block. And, the global data line pairs G/B1~k receives/outputs data from/to the local data line pairs L/B11~1k to L/Bn1~nk.

The semiconductor memory device of FIG. 1 can simultaneously receive and output data.

FIG. 2 is a view illustrating the configuration of a semiconductor memory device of FIG. 1, which is connected between one local data line pair L and LB and one global data line pair G and GB.

In FIG. 2, the semiconductor memory device includes a memory cell array block BLK having memory cells MC, a column selecting gate 12, a local data line pre-charge circuit 14, a block selecting gate 16, a global data line pre-charge circuit 18, a sense amplifier 20, and a write driver 22.

Function of the components of FIG. 2 is explained below.

The memory cell array block BLK includes a plurality of memory cells MC connected between the word line WL and the bit line pair BL and BLB to write and read data. The column selecting gate 12 includes NMOS transistors N11 and N12 that transmit data between the bit line pair BL and BLB and the local data line pair L and LB in response to a column selecting signal CSL. The local data line pre-charge circuit 14 includes NMOS transistors N31 to N33 and pre-charges the local data line pair L and LB in response to a pre-charge control signal PRE. The block selecting gate 16 includes NMOS transistors N21 and N22 that transmit data between the local data line pair L and LB and the global data line pair G and GB in response to a block selecting signal BS. The global data line pre-charge circuit 18 includes PMOS transistors P11 to P13 that pre-charge the global data line pair G and GB in response to an inverted signal of the pre-charge control signal PRE. The sense amplifier 20 amplifies data of the global data line pair G and GB and outputs the data to the data line pair D and DB in response to a sense amplifier control signal IOSA during a read operation. The write driver 22 drives data of the data line pair D and DB and transmits the data to the global data line pair G and GB in response to a write control signal WE during a write operation.

The conventional semiconductor memory device of FIG. 2 pre-charges the local data line pair L and LB to the voltage level obtained by subtracting the threshold voltage Vth of the NMOS transistors N31 to N33 from the power voltage supplied to these NMOS transistors. Also, the memory device of FIG. 2 pre-charges the global data line pair G and GB to the power voltage level supplied to the PMOS transistors P11 to P13, during a pre-charge operation.

The conventional semiconductor memory device causes relatively high power consumption since the global data line pair G and GB is pre-charged to a power voltage level during a pre-charge operation. Also, the write speed is delayed when data having a logic "low" level is transmitted during a write operation due to the time it takes for the pre-charge level to fall to a logic "low" level.

For the foregoing reason, a method of designing the conventional semiconductor memory device so that the global data line pre-charge circuit 18 includes NMOS transistors like the local data line pre-charge circuit 14 is considered. In this case, there is an advantage of improving the write speed. However, when the global data line pair is pre-charged to the voltage level obtained by subtracting the threshold voltage Vth of the NMOS transistor from the power voltage, the voltage difference between the global data line pair is smaller during a read operation. As a result, the gain of the sense amplifier 20 is reduced, and it becomes impossible to amplify and output data of the global data line pair fast and efficiently, adversely affecting the read operation. Therefore, the conventional semiconductor memory device continues to be configured so that the local data line pair is comprised of NMOS transistors and the global data line pair is comprised of PMOS transistors, as shown in FIG. 2, and the novel improvement of the present invention accomplishes the goal of faster speed by another way, as described herein below.

SUMMARY OF THE INVENTION

It is an object of the present invention to provide a semiconductor memory device in which a read operation is not adversely affected even though the pre-charge level of the global data line pair is lowered to improve the write speed.

It is another object of the present invention to provide a data write and read method of a semiconductor memory device in which a read operation is not adversely affected even though the pre-charge level of the global data line pair is lowered to improve the write speed.

In order to achieve these objectives, a first aspect of the present invention provides a semiconductor memory device, comprising: a local data line pair connected to a bit line pair through a predetermined switching means; first and second global data line pairs connected to the local data line pair; a first global data line pre-charge circuit for pre-charging the first global data line pair to a first voltage level; a second global data line pre-charge circuit for pre-charging the second global data line pair to a second voltage level; a first switching circuit connected between the local data line pair and the first global data line pair; a second switching circuit connected between the first global data line pair and the second global data line pair; a sense amplifier for amplifying data of the second global data line pair and outputting the amplified data to a data line; and a data input circuit for outputting data of the data line to the first global data line pair during a write operation.

The semiconductor memory device further includes a local data line pre-charge circuit for pre-charging the local data line pair to the first voltage level. A second aspect of the present invention provides a semiconductor memory device, comprising: a local data line pair connected to a bit line pair through a predetermined switching means; first and second global data line pairs connected to the local data line pair; a first global data line pre-charge circuit for pre-charging the first global data line pair to a first voltage level; a second global data line pre-charge circuit for pre-charging the second global data line pair to a second voltage level; a first switching circuit connected between the local data line pair and the first global data line pair; a sense amplifier for amplifying data of the local data line pair and outputting the amplified data to the first global data line pair; a second switching circuit connecting the first global data line pair and the second global data line pair; a global sense amplifier for amplifying data of the second global data line pair and outputting the amplified data to a data line; and a data input circuit for outputting data of the data line to the first global data line pair during a write operation.

The semiconductor memory device further includes an equalization transistor for equalizing the local data line pair.

The first global data line pre-charge circuit further includes an equalization transistor for equalizing the first global data line pair during a pre-charge operation.

The second global data line pre-charge circuit includes first and second NMOS transistors serially connected between the second global data line pair to pre-charge to the second voltage level during a pre-charge operation.

The second global data line pre-charge circuit includes an equalization transistor for equalizing the second global data line pair during a pre-charge operation.

The semiconductor memory device further includes a level-rising preventing element for preventing a level-rising of the first voltage of the first global data line pair and a level-falling preventing element for preventing a level-falling of the second voltage of the second global data line pair.

The first voltage level is lower than the second voltage level.

The present invention further provides a data write and read method of a semiconductor memory device, comprising: pre-charging a local data line pair and a first global data line pair to a first voltage level and a second global data line pair to a second voltage level during a pre-charge operation; dividing the first global data line pair and the second global data line pair and transmitting data through the first global data line pair and the local data line pair during a write operation; and transmitting data between the first global data line pair and the second global data line pair and transmitting data through the local data line pair, the first global data line pair and the second global data line pair during a read operation.

The first voltage level is lower than the second voltage level.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
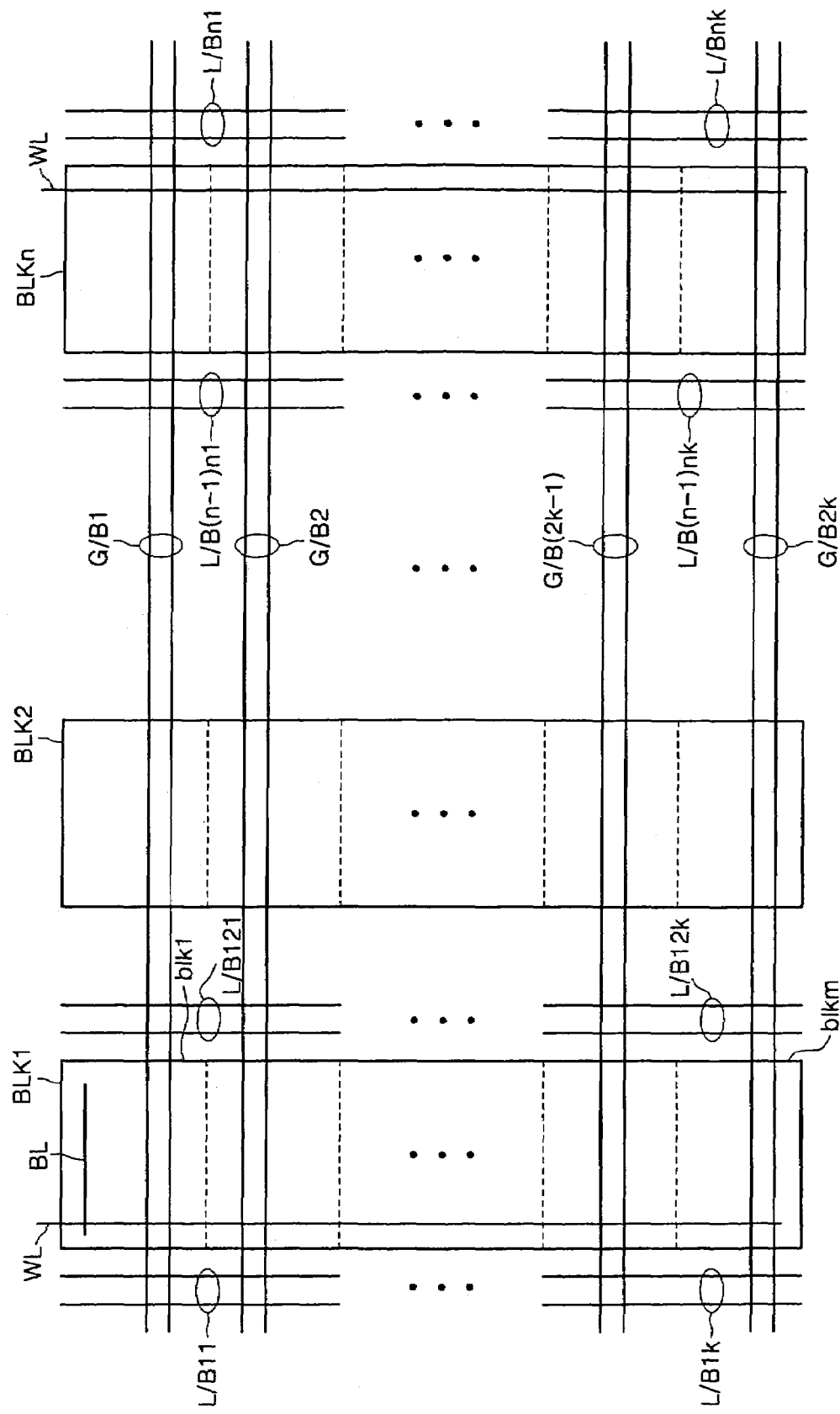
FIG. 1 is a view illustrating a signal line arrangement of a memory cell array of a conventional semiconductor memory device.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout the specification.

Figure 2:
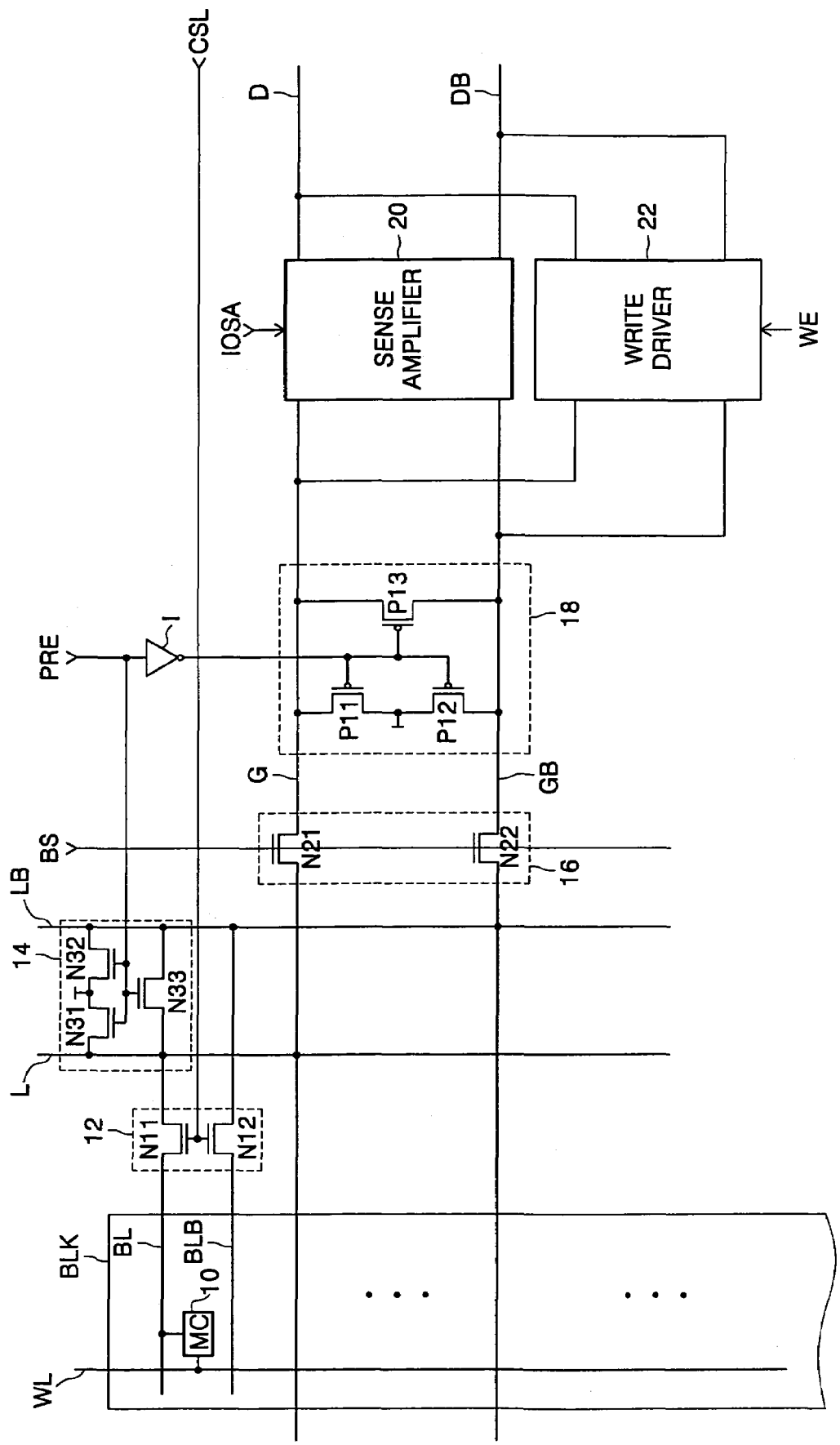
FIG. 2 is a view illustrating a configuration of the semiconductor memory device of FIG. 1.
Figure 3:
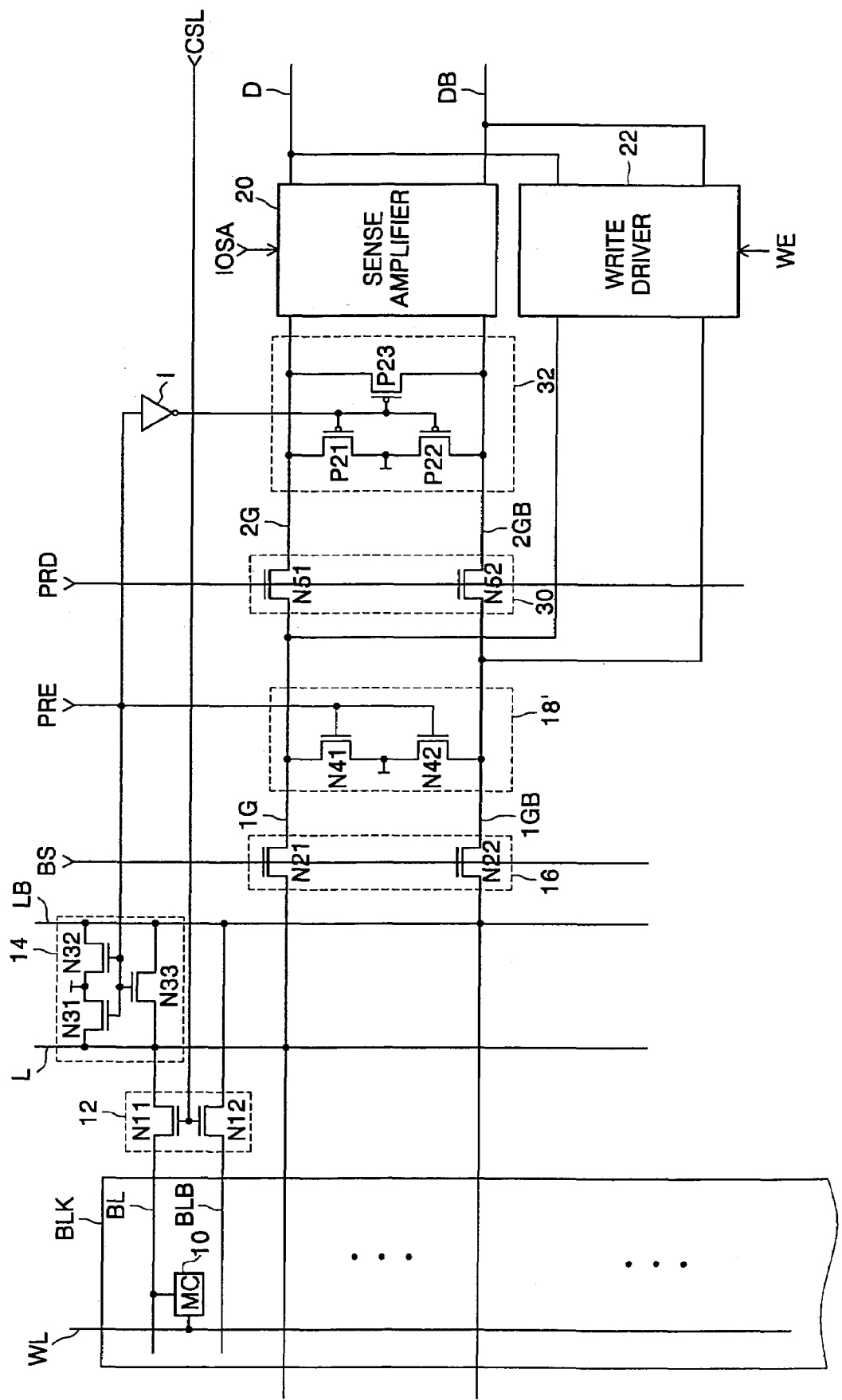
FIG. 3 is a view illustrating a semiconductor memory device according to a first embodiment of the present invention.

FIG. 3 is a view illustrating a semiconductor memory device according to a first embodiment of the present invention. The global data line pre-charge circuit 18 of FIG. 2 is substituted with a first global data line pre-charge circuit 18', and a switching gate 30 and a second global data line pre-charge circuit 32 are added. The global data line pair G and GB is divided into a first global data line pair 1G and 1GB and a second global data line pair 2G and 2GB, and the write driver 22 is connected to the first global data line pair 1G and 1GB.

Like reference numerals of FIGS. 2 and 3 denote like parts and perform like operation, and thus description on those is omitted.

The first global data line pre-charge circuit 18' includes NMOS transistors N41 and N42 connected between the first global data line pair 1G and 1GB and pre-charges the first global data line pair 1G and 1GB to the voltage level obtained by subtracting the threshold voltage Vth of the NMOS transistor from the power voltage in response to a pre-charge control signal PRE. The switching gate 30 includes NMOS transistors N51 and N52 connected between the first global data line pair 1G and 1GB and the second global data line pair 2G and 2GB and transmits data between the first global data line pair 1G and 1GB and second global data line pair 2G and 2GB in response to a switching control signal PRD. The switching control signal PRD is activated only during a read operation or during a read and pre-charge operation. The second global data line pre-charge circuit 32 includes PMOS transistors P21 to P23 between the second global data line pair 2G and 2GB and pre-charges the second global data line pair 2G and 2GB to the power voltage level in response to an inverted pre-charge control signal PRE.

Operation of the semiconductor memory device of FIG. 3 is explained below.

During an active operation, a block selecting signal BS is activated to turn on the block selecting gate 16, so that the local data line pair L and LB and the first global data line pair 1G and 1GB are connected.

During a pre-charge operation, a pre-charge control signal PRE is activated to enable operation of the local data line pre-charge circuit 14, the first global data line pre-charge circuit 18' and the second global data line pre-charge circuit 32. Both a write control signal WE and a sense amplifier control signal IOSA are inactivated to disable operation of the write driver 22 and the sense amplifier 20. A switching control signal PRD is either inactivated to turn off the switching gate 30 or activated to turn on the switching gate 30.

When the switching gate 30 is turned off, the first global data line pair 1G and 1GB and the second global data line pair 2G and 2GB are not connected. The local data line pre-charge circuit 14 and the first global data line pre-charge circuit 18' pre-charge the local data line pair L and LB and the first global data line pair 1G and 1GB, respectively, to a voltage level obtained by subtracting the threshold voltage Vth of the NMOS transistor from the power voltage in response to the pre-charge control signal PRE. The second global data line pre-charge circuit 32 pre-charges the second global data line pair 2G and 2GB to the power voltage level.

On the other hand, when the switching gate 30 is turned on, the first global data line pair 1G and 1GB and the second global data line pair 2G and 2GB are connected. The local data line pair L and LB and the first global data line pair 1G and 1GB are pre-charged to the voltage level obtained by subtracting the threshold voltage Vth from the power voltage, and the second global data line pair 2G and 2GB is pre-charged to the power voltage level. At this time, even though the switching gate 30 is turned on, charge sharing does not occur between the first global data line pair 1G and 1GB and the second global date line pair 2G and 2GB because a voltage difference between the source and drain of the NMOS transistors N51 and N52 is not larger than a threshold voltage Vth. Thus, the first global data line pair 1G and 1GB maintains the voltage level obtained by subtracting the threshold voltage Vth from the power voltage, and the second global data line pair 2G and 2GB maintains the power voltage level.

Consequently, since the local data line pair L and LB and the first global data line pair 1G and 1GB are not pre-charged as high as the power voltage level during the pre-charge operation, the amount of electrical current consumed during the pre-charge operation is reduced.

During a write operation, the write control signal WE is activated to enable operation of the write driver 22, and the sense amplifier control signal IOSA is inactivated to disable operation of the sense amplifier 20. And, a switching control signal PRD is inactivated to turn off the switching gate 30. As a result, the first global data line pair 1G and 1GB and the second global data line pair 2G and 2GB are divided. The write driver 22 drives data of the data line pair D and DB and outputs the data to the first global data line pair 1G and 1GB. Here, since the first global data line pair 1G and 1GB has been pre-charged to the voltage level obtained by subtracting the threshold voltage of the NMOS transistor from the power voltage, data having a logic "high" level, which is transmitted to the first global data line pair 1G and 1GB, maintains the voltage level obtained by subtracting the threshold voltage from the power voltage. Data having a logic "low" level falls to the ground voltage level from the voltage level obtained by subtracting the threshold voltage from the power voltage. Therefore, since data having a logic "low" level falls to the ground voltage not from the power voltage but from the power voltage minus the threshold voltage, the time that the voltage level falls to the ground voltage is shortened, thereby improving the write speed. Then, data of the first global data line pair 1G and 1GB is transmitted to the local data line pair L and LB through the block selecting gate 16, and data transmitted through the local data line pair L and LB is transmitted to the bit line pair BL an BLB through the column selecting gate 12, to be written onto a selected memory cell MC.

During a read operation, a sense amplifier control signal IOSA is activated to enable the sense amplifier 20, and a write control signal WE is inactivated to disable operation of the write driver 22. A switching control signal PRD is activated to turn on the switching gate 30. Therefore, the first global data line pair 1G and 1GB and the second global data line pair 2G and 2GB are connected. Data stored in the selected memory cell MC is transmitted to the first global data line pair 1G and 1GB through the bit line pair BL and BLB, the column selecting gate 12, the local data line pair L and LB, and the block selecting gate 16. For example, when data having a logic "high" level is output from the selected memory cell MC, the data line 1G of the first global data line pair 1G and 1GB maintains the voltage level obtained by subtracting the threshold voltage from the power voltage, and the data line 1GB maintains the voltage level which is $\Delta V1$ lower than the voltage of the data line 1G. Therefore, the voltage difference between the first global data line pair 1G and 1GB is $\Delta V1$. When data having a logic "high" level is transmitted to the second global data line pair 2G and 2GB, the data line 2G of the second global data line pair 2G and 2GB maintains the power voltage level, and the data line 2GB has a voltage level which is $\Delta V2$ lower than the power voltage. At this time, the voltage difference between the second global data line pair 2G and 2GB is $\Delta V2$ which is greater than $\Delta V1$. The reason that the voltage difference $\Delta V2$ between the second global data line pair 2G and 2GB is greater than the voltage difference $\Delta V1$ between the first global data line pair 1G and 1GB is because the voltage difference between the sources and drains of the two NMOS transistors of the switching gate 30 and the voltage difference between the sources and gates thereof differ from each other, and so the difference of the current Ids flowing through the second global data line 2G and the second global data line 2GB greatly differs, resulting in a second amplifying phenomenon. Therefore the voltage difference between the second global data line pair 2G and 2GB is great and so the gain of the sense amplifier 20 is not reduced, and the sense amplifier 20 amplifies the voltage difference $\Delta V2$ of the second global data line pair 2G and 2GB and outputs the amplified data to the data line pair D and DB. Therefore, the sense amplifier 20 can amplify and output data of the second global data line pair 2G and 2GB fast and efficiently.

Figure 4:
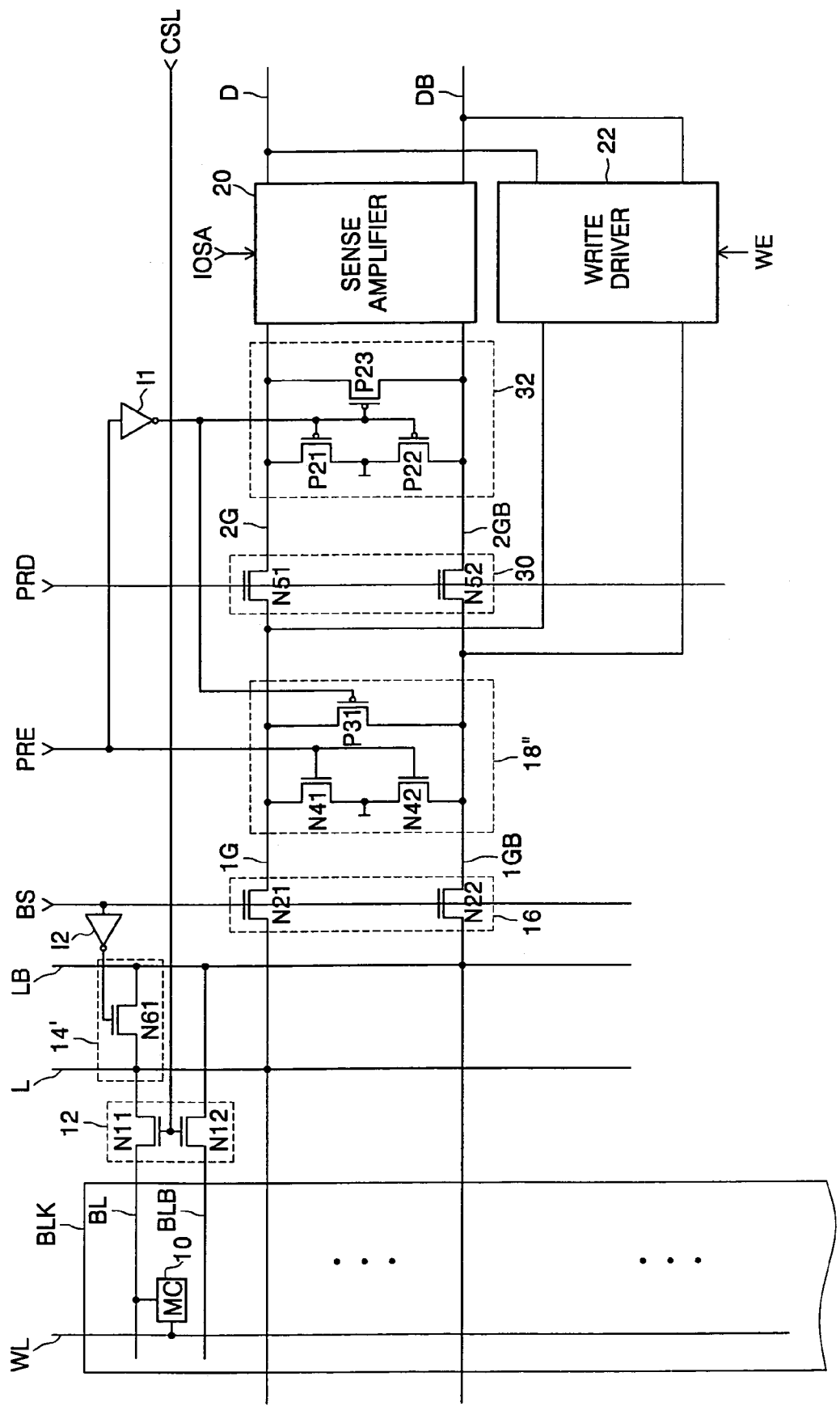
FIG. 4 is a view illustrating a semiconductor memory device according to a second embodiment of the present invention.

FIG. 4 is a view illustrating a semiconductor memory device according to a second embodiment of the present invention. The semiconductor memory device has the same configuration as that of FIG. 3 except that the local data line pre-charge circuit 14 is substituted with an equalization circuit 14', the first global data line pre-charge circuit 18' is substituted with a first global data line pre-charge circuit 18'', the inverter I is substituted with an inverter I1, and an inverter I2 is added.

Like reference numerals of FIGS. 3 and 4 denote like parts and perform like operation, and so description on those is omitted.

The first global data line pre-charge circuit 18'' includes NMOS transistors N41 and N42 and a PMOS transistor P31 connected between the first global data line pair 1G and 1GB, and pre-charges and equalizes the local data line pair L and LB and the first global data line pair 1G and 1GB to the voltage obtained by subtracting the threshold voltage Vth of the NMOS transistor from the power voltage in response to the pre-charge control signal PRE. That is, the first global data line pre-charge circuit 18'' has an equalization function in addition to the function of the first global data line pre-charge circuit 18'. The local data line equalization circuit 14' includes an NMOS transistor N61 and is turned off in response to a block selecting signal BS, or turned on in response to an inverted block selecting signal BS to equalize the local data line pair L and LB. That is, the local data line pre-charge circuit 14' performs a function of equalizing the local data line pair L and LB when the memory cell array block BLK is not selected.

The semiconductor memory device of FIG. 4 pre-charges and equalizes the local data line pair L and LB by using the first global data line pre-charge circuit 18'' other than the local data line pre-charge circuit 14'. Therefore, it does not matter that the local data line pre-charge circuit 14' connected to the local data line pair L and LB is not provided. But, in this case, when the memory cell array block BLK is not selected, the equalization circuit 14' is required to equalize the local data line pair L and LB.

Write and read operations of the semiconductor memory device of FIG. 4 are easily understood with reference to the description of FIG. 3, and so an active and pre-charge operation are explained below.

During an active operation, a block selecting signal BS is activated to turn on the block selecting gate 16, so that the local data line pair L and LB and the first global data line pair 1G and 1GB are connected, and operation of the local data line equalization circuit 14' is disabled.

During the pre-charge operation, the pre-charge control signal PRE is activated to enable operation of the first global data line pre-charge circuit 18'' and the second global data line pre-charge circuit 32. Both the write control signal WE and the sense amplifier control signal IOSA are inactivated to disable operation of the write driver 22 and the sense amplifier 20. The switching control signal PRD is inactivated to turn off the switching gate 30. Therefore, the first global data line pair 1G and 1GB and the second global data line pair 2G and 2GB are divided. The first global data line pre-charge circuit 18'' pre-charges the local data line L and LB and the first global data line pair 1G and 1GB to the voltage level obtained by subtracting the threshold voltage Vth of the NMOS transistor from the power voltage in response to the pre-charge control signal PRE. The second global data line pre-charge circuit 32 pre-charges the second global data line pair 2G and 2GB to the power voltage level. When a switching control signal PRD is activated to turn on the switching gate 30, the local data line pair L and LB and the first global data line pair 1G and 1GB are pre-charged to the power voltage level minus the threshold voltage Vth, and the second global data line pair 2G and 2GB is pre-charged to the power voltage level, as before. Consequently, since the local data line pair L and LB and the first global data line pair 1G and 1GB are not pre-charged to the power voltage level during the pre-charge operation, the electrical current consumed during the pre-charge operation is reduced.

The semiconductor memory device of FIG. 4 has a different circuit configuration from that of FIG. 3 but performs the same operation as that of FIG. 3.

Figure 5:
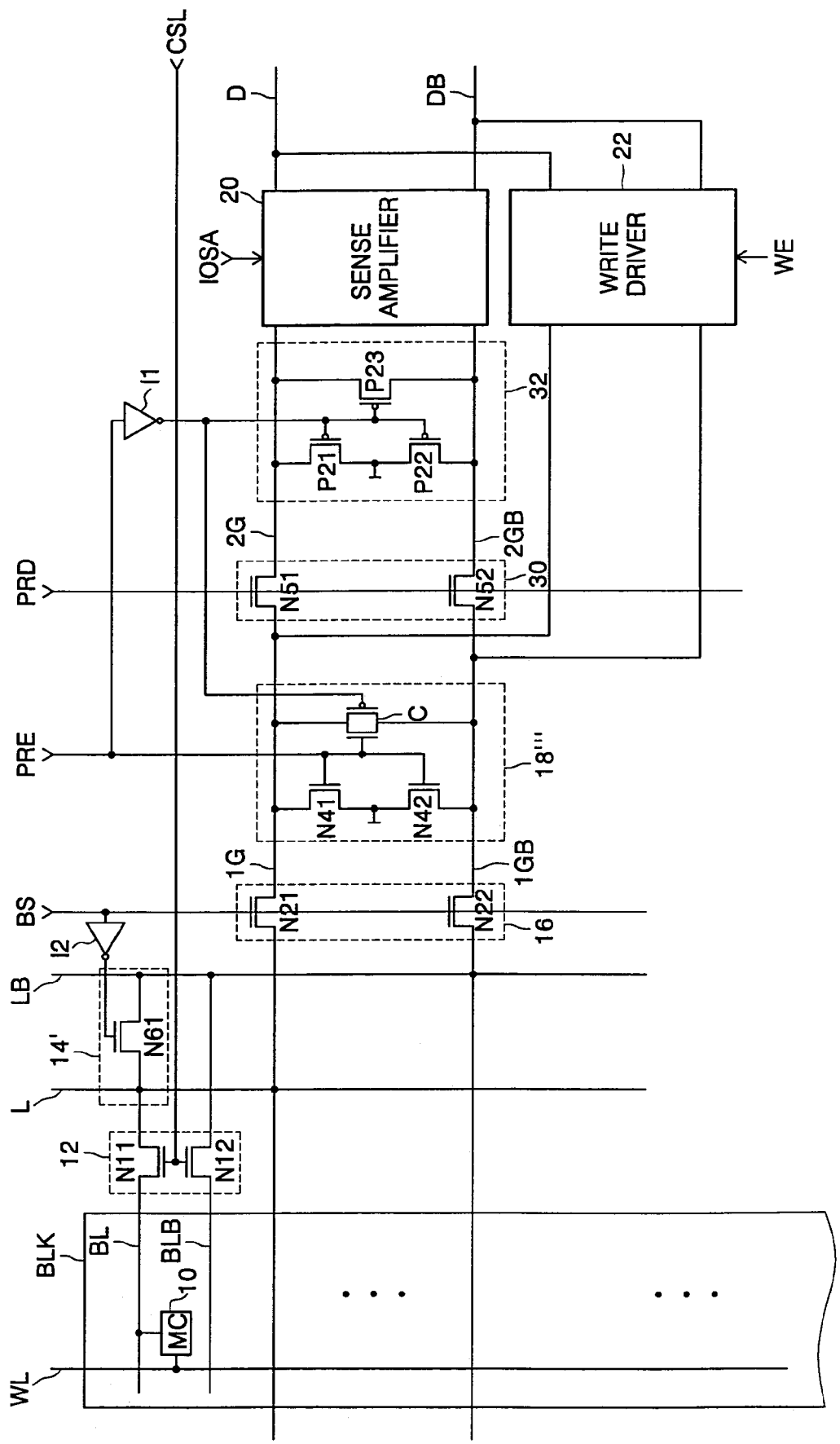
FIG. 5 is a view illustrating a semiconductor memory device according to a third embodiment of the present invention.

FIG. 5 is a view illustrating a semiconductor memory device according to a third embodiment of the present invention. The semiconductor memory device of FIG. 5 has the same configuration as that of FIG. 4 except that the first global data line pre-charge circuit 18'' is replaced with the first global data line pre-charge circuit 18'''.

The first global data line pre-charge circuit 18''' of FIG. 5 is configured to replace the PMOS transistor P31 of the first global data line pre-charge circuit 18'' of FIG. 4 with a CMOS transmission gate C.

The semiconductor memory device of FIG. 5 has a different circuit configuration from that of FIG. 4 but performs the same operation as that of FIG. 4.

Figure 6:
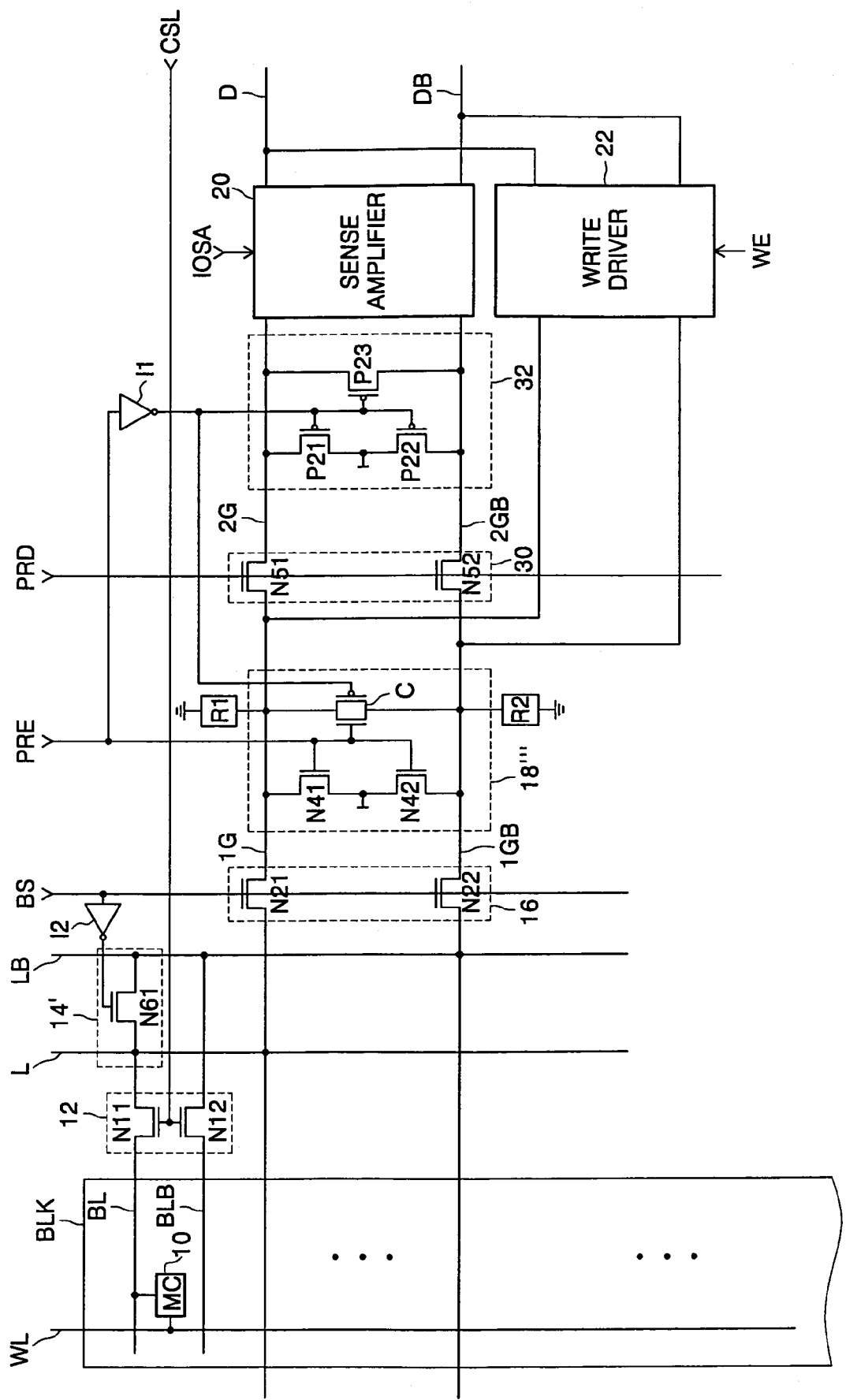
FIG. 6 is a view illustrating a semiconductor memory device according to a fourth embodiment of the present invention.

FIG. 6 is a view illustrating a semiconductor memory device according to a fourth embodiment of the present invention. The semiconductor memory device of FIG. 6 has the same configuration as that of FIG. 5 except that resistors R1 and R2 are added.

In FIG. 6, the resistor R1 is connected between the first global data line 1G and the ground voltage, and the resistor R2 is connected between the inverted first global data line 1GB and the ground voltage. Also, resistance values of the resistors R1 and R2 are relatively great.

Like reference numerals of FIGS. 5 and 6 denote like parts and perform like operations, and so description on those is omitted.

The resistors R1 and R2 function to prevent data having a logic "high" level of the first global data line pair 1G and 1GB from rising more than the voltage level obtained by subtracting a threshold voltage Vth of the NMOS transistor from a power voltage during a pre-charge operation. That is, the resistors R1 and R2 act to maintain the pre-charge level of the first global data line pair 1G and 1GB to the voltage level of the power voltage minus the threshold voltage Vth.

The semiconductor memory device of FIG. 6 has the different configuration from that of FIG. 5 but perform more stable operation.

Figure 7:
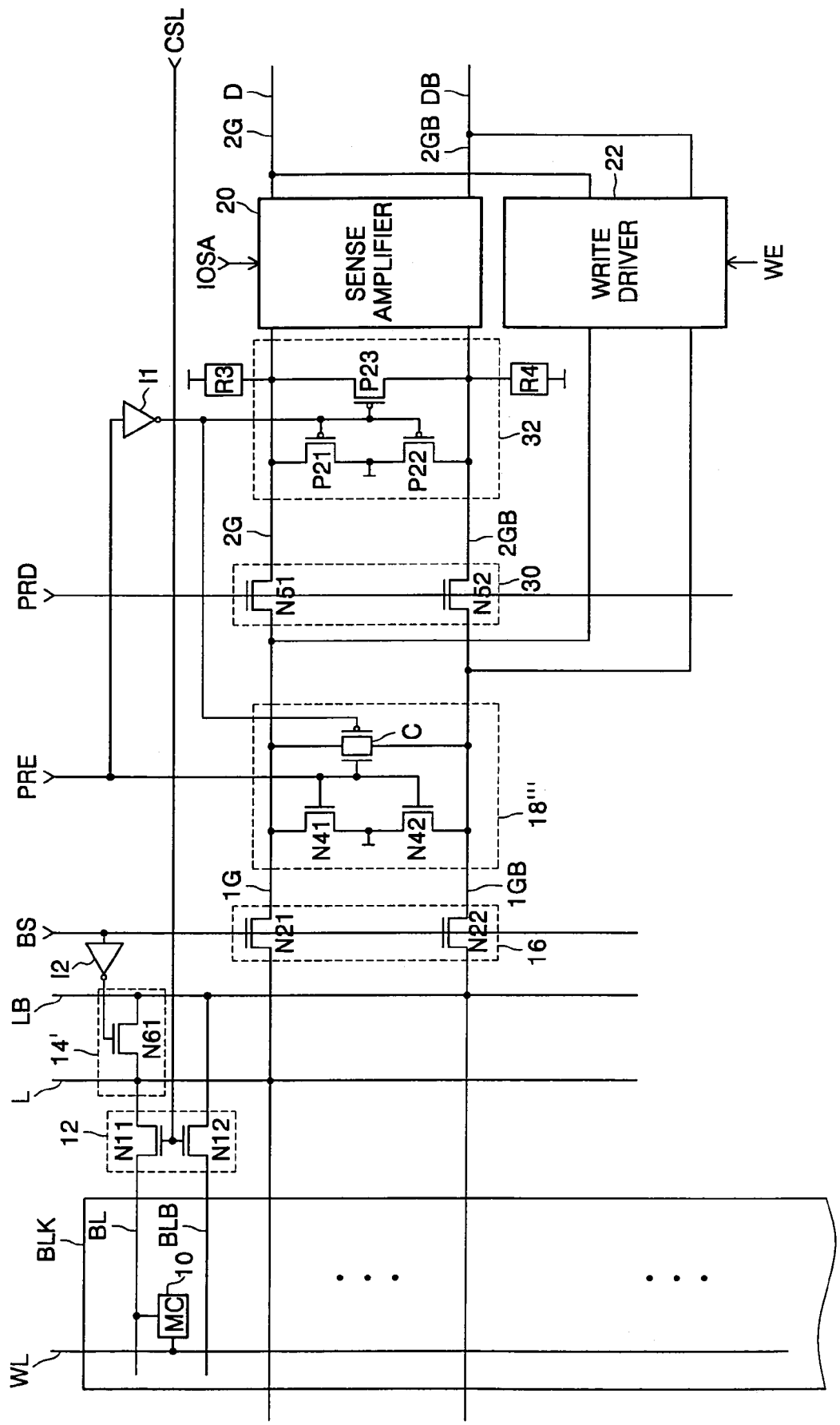
FIG. 7 is a view illustrating a semiconductor memory device according to a fifth embodiment of the present invention.

FIG. 7 is a view illustrating a semiconductor memory device according to a fifth embodiment of the present invention. Resistors R3 and R4 are added to the second global data line pair 2G and 2GB.

In FIG. 7, the resistor R3 is connected between the second global data line 2G and the power voltage, and the resistor R4 is connected between the inverted second global data line 2GB and the power voltage. Also, resistance values of the resistors R3 and R4 are relatively small.

Like reference numerals of FIGS. 6 and 7 denote like parts and perform like operations, and so description on those is omitted.

The resistors R3 and R4 serve to prevent the level of the second global data line pair 2G and 2GB from dropping during the pre-charge and read operation. Therefore, it is possible to prevent the gain of the sense amplifier 20 from being reduced during a read operation.

When the resistors R3 and R4 are not provided, a voltage level of the second global data line pair 2G and 2GB drops during a read operation. Thus, data having a logic "high" level of the second global data line pair 2G and 2GB drops to a level which is lower than the power voltage level. As a result, the voltage difference between the source and drain of the NMOS transistor of the switching gate 30 is reduced, an amount of an electrical current flowing from the second global data line pair 2G and 2GB to the first global data line pair 1G and 1GB is reduced, whereby a level of the second global data line pair 2G and 2GB does not fall sufficiently. Therefore, the voltage difference between the second global data line pair 2G and 2GB is reduced, so that a gain of the sense amplifier 20 is reduced and it is impossible to amplify and output the data fast and efficiently.

The semiconductor memory device of FIG. 7 has a different configuration from that of FIG. 6 but performs a more stable operation.

Figure 8:
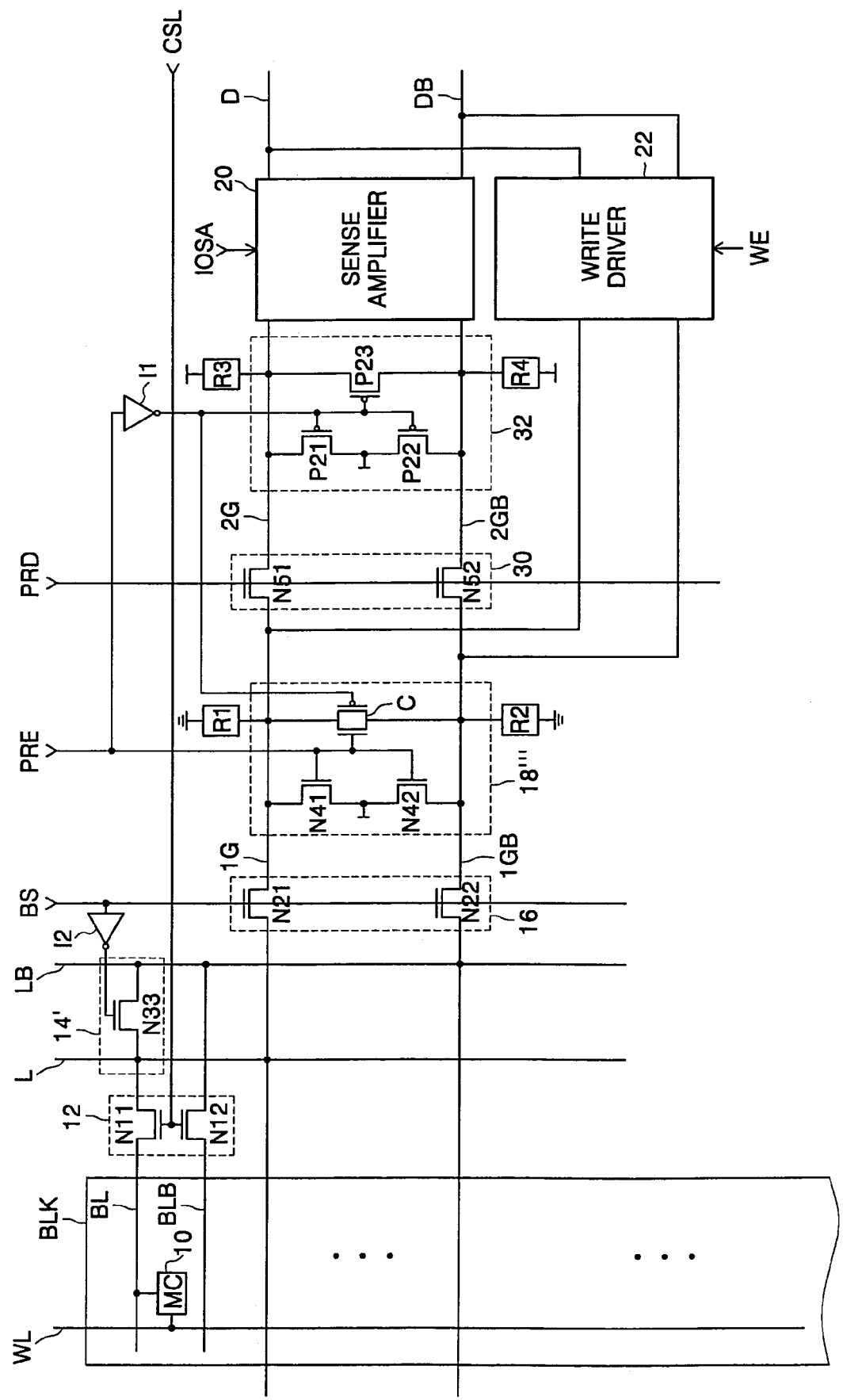
FIG. 8 is a view illustrating a semiconductor memory device according to a sixth embodiment of the present invention.

FIG. 8 is a view illustrating a semiconductor memory device according to a sixth embodiment of the present invention. Resistors R1 to R4 are added to a configuration of the semiconductor memory device of FIG. 5.

In FIG. 8, the resistors R1 and R2 perform the same function as those of FIG. 6, and the resistors R3 and R4 perform the same function as those of FIG. 7. Therefore, the semiconductor memory device of FIG. 8 can perform a more stable operation than those of FIGS. 6 and 7.

Figure 9:
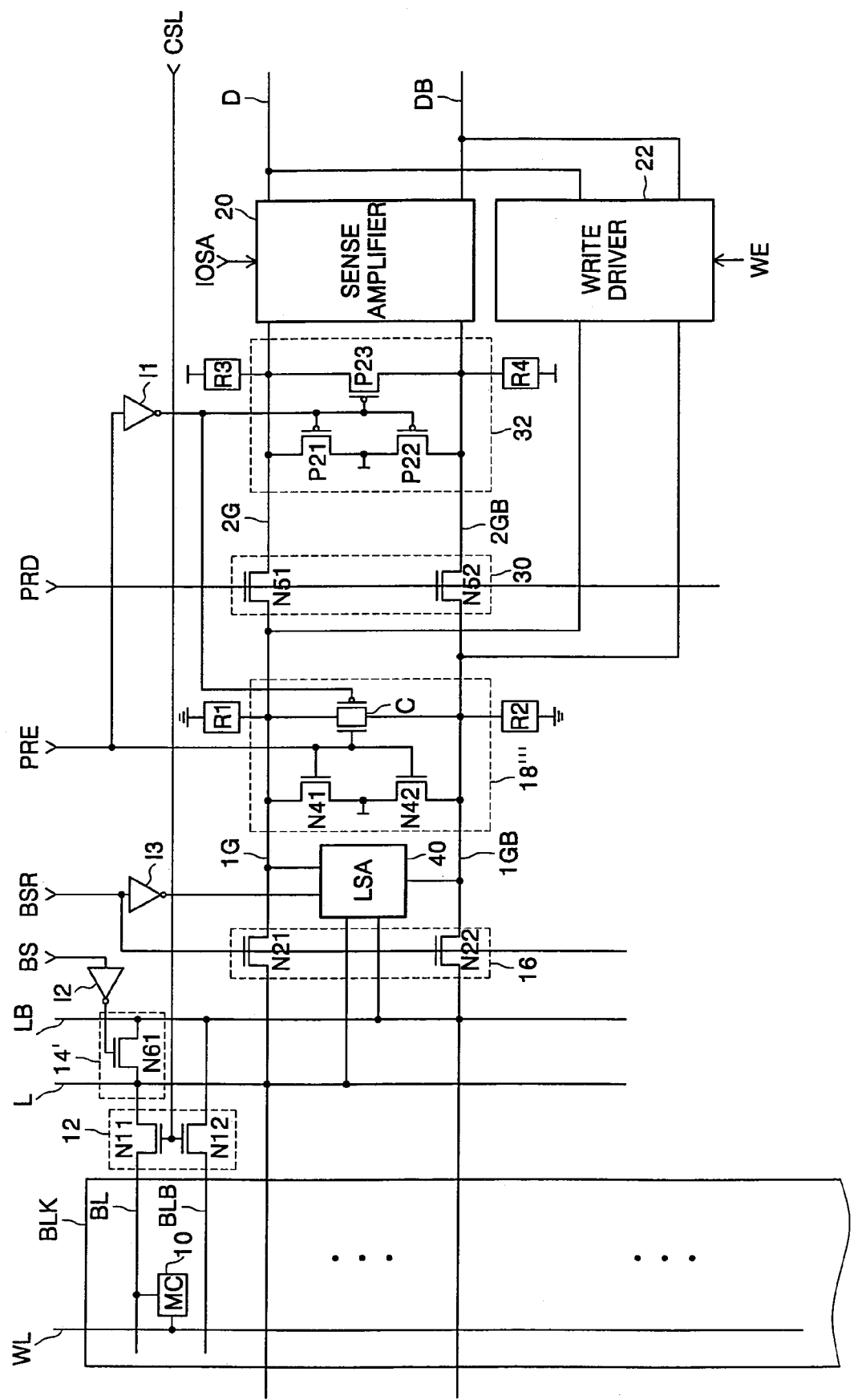
FIG. 9 is a view illustrating a semiconductor memory device according to a seventh embodiment of the present invention.

FIG. 9 is a view illustrating a semiconductor memory device according to a seventh embodiment of the present invention. A local sense amplifier LSA 40 and an inverter 13 are added to the configuration of the semiconductor memory device of FIG. 8.

In FIG. 9, the local sense amplifier LSA 40 is enabled in response to an inverted control signal BSR, and the block selecting gate is turned on by the control signal BSR.

The control signal BSR is a signal which is activated when the block selecting signal BS is activated and the pre-charge control signal PRE or the write control signal WE is activated.

During a read operation, the semiconductor memory device of FIG. 9 does not transmit data from the local data line pair L and LB to the first global data line pair 1G and 1GB through the block selecting gate 16 but instead amplifies data of the local data line pair L and LB by the local sense amplifier LSA 40 and outputs the amplified data to the first global data line pair 1G and 1GB. Therefore, in this case, the block selecting gate 16 is turned off in response to a control signal BSR during a read operation.

Consequently, the semiconductor memory device of FIG. 9 performs a different operation from that of FIG. 8 in that it amplifies data of the local data line pair L and LB by the local sense amplifier LSA 40 and outputs the amplified data to the first global data line pair 1G and 1GB during a read operation.

The sense amplifier of FIG. 9 can be applied to the configurations of the semiconductor memory devices of FIGS. 3 to 8.

Figure 10:
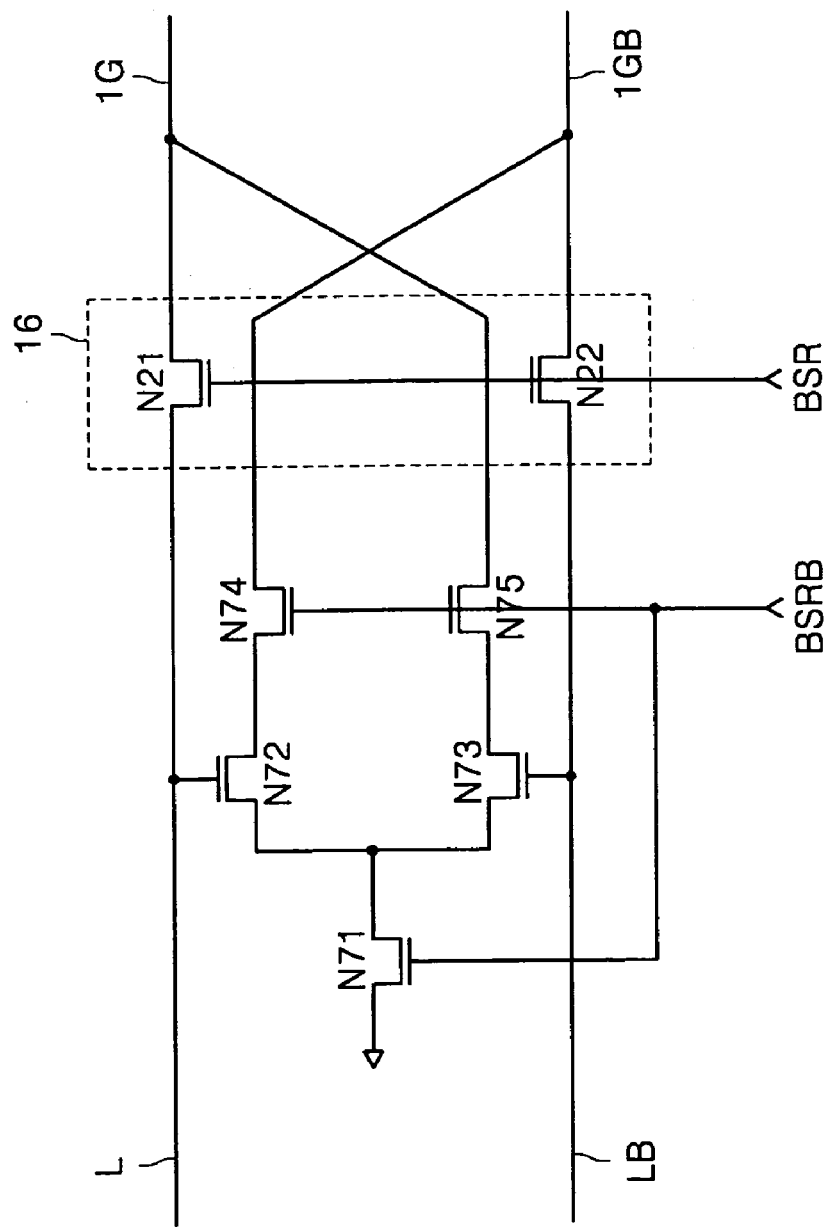
FIG. 10 is a view illustrating the configuration of the local sense amplifier of FIG. 9.

FIG. 10 is a view illustrating the configuration of the local sense amplifier of FIG. 9. The local sense amplifier LSA 40 includes NMOS transistors N71 to N75.

In FIG. 10, the control signal BSRB is a signal generated by inverting the control signal BSR by the inverter 13.

Operation of the local sense amplifier of FIG. 10 is explained below.

When a control signal BSRB is activated and set to a logic "high" level, the NMOS transistors N71, N74 and N75 are turned on to enable operation of the local sense amplifier LSA 40.

In this state, when a voltage difference occurs between the local data line pair L and LB, an electrical current flows through each of the NMOS transistors N72 and N73 from the first global data line pair 1G and 1GB. At this time, when a voltage applied to each of the NMOS transistors N72 and N73 is large, a large amount of current flows, and when a voltage applied to each of the NMOS transistors N72 and N73 is small, a small amount of current flows. Then, data between the first global data line pair 1G and 1GB is developed.

As described above, the local sense amplifier of FIG. 10 amplifies data of the local data line pair L and LB and transmits the amplified data to the first global data line pair 1G and 1GB.

Figure 11A:
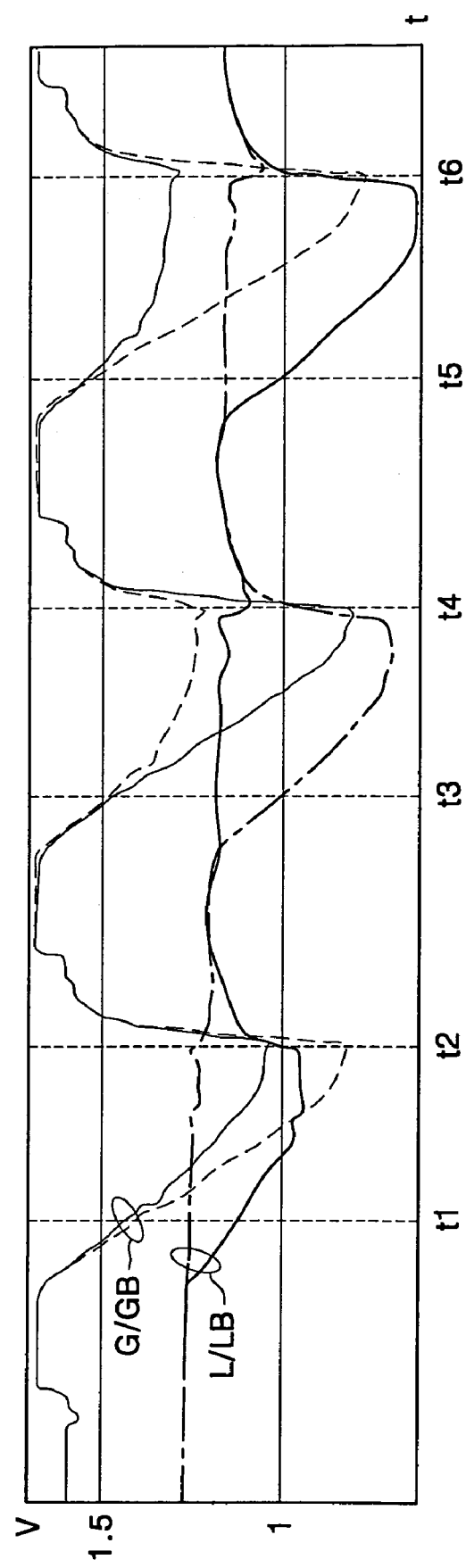
FIG. 11a is a wave diagram illustrating data of a local data line pair and a global data line pair during a read operation of the conventional semiconductor memory device.
Figure 11B:
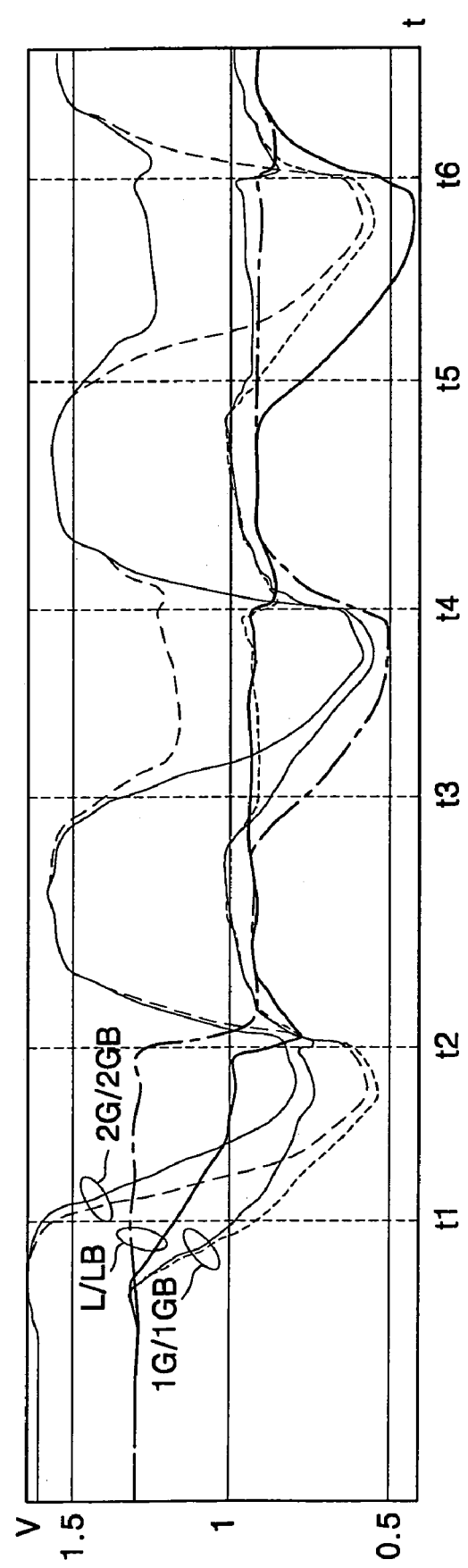
FIG. 11b is a wave diagram illustrating data of a local data line pair and a first global data line pair during a read operation of the semiconductor memory device of the present invention.

FIG. 11A is a wave diagram illustrating data of the local data line pair L and LB and the global data line pair G and GB during a read operation of the conventional semiconductor memory device, and FIG. 11B is a wave diagram illustrating data of the local data line pair L and LB and the first global data line pair 1G and 1GB and the second global data line pair 2G and 2GB during a read operation of the semiconductor memory device of the present invention, where the horizontal axis denotes the time and the vertical axis denotes voltage.

FIGS. 11A and 11B show the wave diagrams when data are read continually from the different bit line pair after one word line is selected.

As can be seen in FIG. 11A, in the conventional semiconductor memory device, the voltage difference between the local data line pair L and LB is almost the same as the voltage difference between the global data line pair G and GB. On the other hand, in the inventive semiconductor memory device, the voltage difference between the second global data line pair 2G and 2GB is greater than the voltage difference between the first global data line pair 1G and 1GB at time intervals t1–t2, t3–t4, and t5–t6 as be seen in FIG. 1B.

Figure 11C:
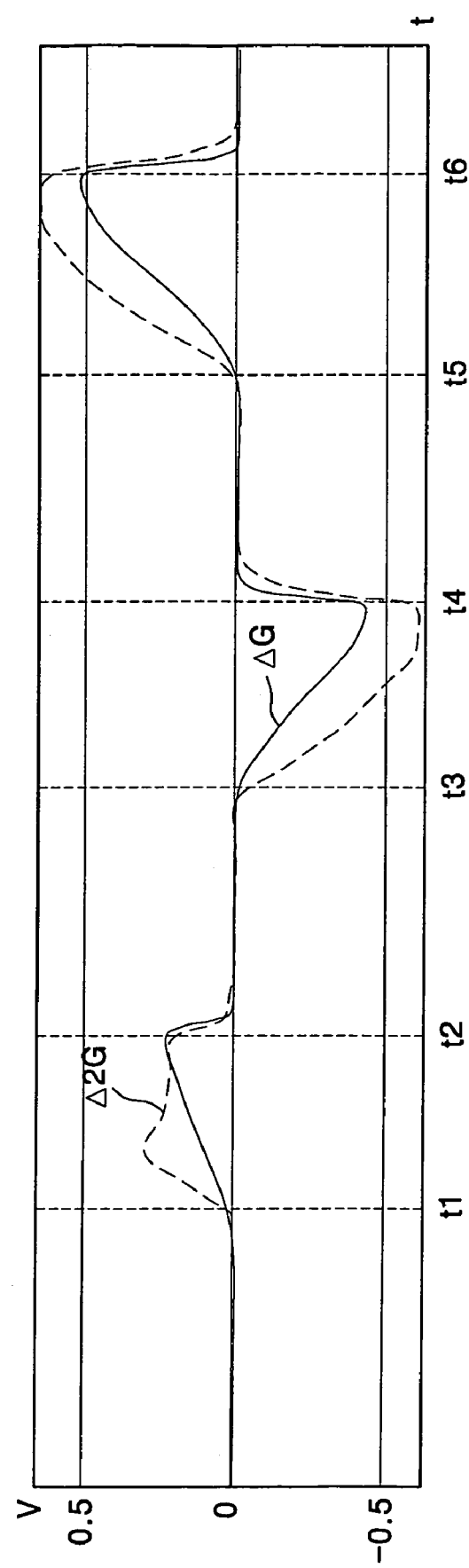
FIG. 11c is a wave diagram illustrating a voltage difference between a global data line pair of the conventional semiconductor memory device and a voltage difference between a second global data line pair of the inventive semiconductor memory device.

FIG. 11C is a wave diagram illustrating the voltage difference ΔG between the global data line pair G and GB of the conventional semiconductor memory device and the voltage difference Δ2G between the second global data line pair 2G and 2GB of the inventive semiconductor memory device. As can be seen in FIG. 11C, the voltage difference ∆2G of the inventive semiconductor memory device is increased compared to the voltage difference ∆G of the conventional semiconductor memory device, at the time intervals t1–t2, t3–t4, and t5–t6.

Therefore, the semiconductor memory device of the present invention can amplify and output data fast and efficiently during a read operation because the gain of the sense amplifier is increased.

Therefore, the semiconductor memory device of the present invention pre-charges the first global data line pair to the voltage level obtained by subtracting the threshold voltage from the power voltage, and pre-charges the second global data line pair to the power voltage during the pre-charge operation, thereby reducing the electrical current consumed during the pre-charge operation.

Also, the semiconductor memory device of the present invention writes data through the first global data line pair during the write operation, thereby reducing the swing width of data, and thus improving the write speed.

Also, since the voltage difference of the second global data line pair is not reduced during the read operation, the gain of the sense amplifier is not reduced, whereby data is amplified and outputted fast and efficiently.

As described herein before, the semiconductor memory device and the data write and read method according to the present invention can reduce the electrical current consumed during a pre-charge operation and improve the write speed.

Also, the semiconductor memory device and the data write and read method according to the present invention can prevent a read speed from being adversely affected since a voltage difference between the global data line pair is not reduced during a read operation.

What is claimed is:

1. A semiconductor memory device, comprising:
   a local data line pair connected to a bit line pair through a predetermined switching means;
   first and second global data line pairs connected to the local data line pair;
   a first global data line pre-charge circuit for pre-charging the first global data line pair to a first voltage level;
   a second global data line pre-charge circuit for pre-charging the second global data line pair to a second voltage level;
   a first switching circuit connected between the local data line pair and the first global data line pair;
   a second switching circuit connected between the first global data line pair and the second global data line pair;
   a sense amplifier for amplifying data of the second global data line pair and outputting the amplified data to a data line; and
   a data input circuit for outputting data of the data line to the first global data line pair during a write operation.

2. The device of claim 1, wherein the first global data line pre-charge circuit includes fourth and fifth NMOS transistors serially connected between the first global data line pair to pre-charge to the first voltage level during a pre-charge operation.

3. The device of claim 2, wherein the first global data line pre-charge circuit includes an equalization transistor for equalizing the first global data line pair during a pre-charge operation.

4. The device of claim 3, wherein the equalization transistor includes a first PMOS transistor.

5. The device of claim 4, wherein the equalization transistor further includes a first NMOS transistor.

6. The device of claim 2, wherein the second global data line pre-charge circuit includes sixth and seventh NMOS transistors serially connected between the second global data line pair to pre-charge to the second voltage level during a pre-charge operation.

7. The device of claim 6, wherein the second global data line pre-charge circuit includes an equalization transistor for equalizing the second global data line pair during a pre-charge operation.

8. The device of claim 7, wherein the equalization transistor includes a second PMOS transistor.

9. The device of claim 6, further comprising, a level falling preventing element for preventing a level falling of the second voltage of the second global data line pair.

10. The device of claim 9, wherein the level falling preventing element includes third and fourth resistors connected between the respective second global data line pair and a power voltage.

11. The device of claim 2, further comprising, a level rising preventing element for preventing a level rising of the first voltage of the first global data line pair.

12. The device of claim 11, wherein the level rising preventing element includes first and second resistors connected between the respective first global data line pair and a ground voltage.

13. The device of claim 1, wherein the first voltage level is lower than the second voltage level.

14. The device of claim 1, wherein the second switching circuit includes second and third NMOS transistors connected between the first global data line pair and the second global data line pair.

15. The device of claim 1, further comprising a local data line pre-charge circuit for pre-charging the local data line pair to the first voltage level.

16. The device of claim 15, wherein the local data line pre-charge circuit includes
   first and second NMOS transistors serially connected between the local data line pair to pre-charge to the first voltage level during a pre-charge operation; and
   a third NMOS transistor connected to the local data line pair to equalize the local data line pair.

17. The device of claim 1, further comprising:
   a local sense amplifier for amplifying data of the local data line pair and outputting the amplified data to the first global data line pair.

18. The device of claim 17, further comprising, an equalization transistor for equalizing the local data line pair.

19. The device of claim 18, wherein the equalization transistor includes a first MOS transistor.

20. The device of claim 17, wherein the first global data line pre-charge circuit includes second and third NMOS transistors serially connected between the first global data line pair to pre-charge to the first voltage level during a pre-charge operation.

21. The device of claim 20, wherein the first global data line pre-charge circuit further includes an equalization transistor for equalizing the first global data line pair during a pre-charge operation.

22. The device of claim 21, wherein the equalization transistor includes a PMOS transistor.

23. The device of claim 22, wherein the equalization transistor further includes an NMOS transistor.

24. The device of claim 20, wherein the second global data line pre-charge circuit includes fourth and fifth MOS transistors serially connected between the second global data line pair to pre-charge to the second voltage level during a pre-charge operation.

25. The device of claim 24, wherein the second global data line pre-charge circuit further includes an equalization transistor for equalizing the second global data line pair during a pre-charge operation.

26. The device of claim 25, wherein the equalization transistor includes a sixth MOS transistor.

27. The device of claim 24, further comprising, a level falling preventing element for preventing a level falling of the second voltage of the second global data line pair.

28. The device of claim 27, wherein the level falling preventing element includes third and fourth resistors connected between the respective second global data line pair and a power voltage.

29. The device of claim 20, further comprising, a level rising preventing element for preventing a level rising of the first voltage of the first global data line pair.

30. The device of claim 29, wherein the level rising preventing element includes first and second resistors connected between the respective first global data line pair and a ground voltage.

31. The device of claim 17, wherein the first voltage level is lower than the second voltage level.

32. A data write and read method of a semiconductor memory device, comprising:

pre-charging a local data line pair and a first global data line pair to a first voltage level and a second global data line pair to a second voltage level during a pre-charge operation;

dividing the first global data line pair and the second global data line pair and transmitting data through the first global data line pair and the local data line pair during a write operation; and transmitting data between the first global data line pair and the second data line pair and transmitting data through the local data line pair, the first global data line pair and the second global data line pair during a read operation.

33. The method of claim 32, wherein the first voltage level is lower than the second voltage level.

* * * * *

UNITED STATES PATENT AND TRADEMARK OFFICE
CERTIFICATE OF CORRECTION

| | | |
|---|---|---|
| PATENT NO. | : 7,154,796 B2 | Page 1 of 1 |
| APPLICATION NO. | : 11/009248 | |
| DATED | : December 26, 2006 | |
| INVENTOR(S) | : Hi-Choon Lee et al. | |

It is certified that error appears in the above-identified patent and that said Letters Patent is hereby corrected as shown below:

Column 10, lines 62, the word "1B." should read -- 11B. --.

Signed and Sealed this

Twenty-sixth Day of August, 2008

JON W. DUDAS
*Director of the United States Patent and Trademark Office*